United States Patent [19]

Trenkler et al.

[11] Patent Number: 4,811,154

[45] Date of Patent: Mar. 7, 1989

[54] APPARATUS FOR RAPID RECOGNITION OF SHORT-CIRCUITS

[75] Inventors: Gerhard Trenkler, Braunschweig; Reinhard Maier, Herzogenaurach; Thomas Nippert, Hamburg, all of Fed. Rep. of Germany

[73] Assignee: Siemens Aktiengesellschaft, Berlin and Munich, Fed. Rep. of Germany

[21] Appl. No.: 79,760

[22] Filed: Jul. 30, 1987

[30] Foreign Application Priority Data

Aug. 4, 1986 [DE] Fed. Rep. of Germany ....... 3626400

[51] Int. Cl.$^4$ ............................................. H02H 3/18
[52] U.S. Cl. ...................................... 361/93; 361/79; 361/88
[58] Field of Search ...................... 361/78, 79, 85–88, 361/91–93

[56] References Cited

U.S. PATENT DOCUMENTS

| 3,984,737 | 10/1976 | Okamura et al. | 361/80 |
| 4,148,087 | 4/1979 | Phadke | 361/80 |
| 4,300,182 | 11/1981 | Schweitzer, III | 361/79 |
| 4,455,612 | 6/1984 | Girgis et al. | 361/80 |
| 4,466,071 | 8/1984 | Russel, Jr. | 361/83 |

FOREIGN PATENT DOCUMENTS 2609654 9/1977 Fed. Rep. of Germany .
3132730 3/1983 Fed. Rep. of Germany .

OTHER PUBLICATIONS

Elektrotechnische Zeitschrift E.T.Z.-A, vol. 94, No. 4, Apr. 1973, pp. 216–220.
IEEE Transactions on Power Apparatus & Systems, vol. 91, May 1971, pp. 1235–1240.

Primary Examiner—A. D. Pellinen
Assistant Examiner—Jeffrey A. Gaffin
Attorney, Agent, or Firm—Kenyon & Kenyon

[57] ABSTRACT

The invention relates to a configuration for rapid detection of short-circuits and for generating an electrical trigger command with an electronic measuring and processing configuration for current values, which compared in a digital comparison circuit with predetermined limit values transmits the trigger command. The measuring configuration determines the current over time as well as the voltage of the grid and the resulting complex impedances and power. In addition to segmentation, standardization and scaling of the current and voltage values, a cross correlation function as well as the respective product and quotient of the Fourier transforms of the voltage and the current for frequency ranges associated with each other are determined, so that a respective power and impedance spectrum are obtained for evaluating the state of the installation.

20 Claims, 2 Drawing Sheets

APPARATUS FOR RAPID RECOGNITION OF SHORT-CIRCUITS

BACKGROUND OF THE INVENTION

The present invention relates to an apparatus for the rapid recognition of short circuits and for generating an electrical trigger command with an electronic measuring and processing configuration for current values, which in a digital comparison circuit compared to predetermined limit values transmits the trigger command.

In a known configuration of the above mentioned kind (DE-OS No. 26 09 654) only the current is detected, so that no information about converted power, power factor and other parameters can be made and extraneous interferences also cannot readily be distinguished. The present invention is based on the task of creating a configuration of the above mentioned kind, in which, by avoiding the above mentioned drawbacks, the nature of the users in the operating state and their behavior can be ascertained. This is accomplished by the measuring configuration measuring the time variations of the current as well as the voltage of the grid and on that basis determining the complex impedances and power.

A configuration for influencing a switchgear as a function of data regarding the state of the grid through an impedance measuring device with a processing stage, which blocks switching on of the switchgear as a function of predetermined impedance values is known per se (DE-OS No. 33 47 209). The impedance measurements carried out here do not give direct information regarding the converted currents. In order to make determination of impedance values for individual associated discrete frequency values possible, so that some idea of the behavior of the impedance as a function of frequency can be obtained it is of advantage, if a configuration is provided, which converts the time variations of current and voltage into the associated frequency range. In order to extract the values characteristic for the impedance and classify them with respect to their magnitude from the general run of the impedance over the frequency it is advantageous if a configuration is provided, which carries out an identification calculation and completes classification of the electrical parameters of the installation component. In order to keep electronic interferences from reaching the evaluation it is advantageous, if a configuration for filtering the measured current and the voltage is provided before the subsequent investigations. Filtering measured values is known per se (8047 IEEE Trans. on Power Apparatus & Syst., Vol. PA8-99, 1980, Jan/Feb.. No 1, page 153). In order to build a reliable cost-efficient configuration of the above mentioned kind, it is advantageous if a configuration is provided, which converts the current and the voltage into digital number sequences after they are filtered and carries out the subsequent investigations with digital electric function modules. Digital to analog converters are also known from the above mentioned publication, page 153. In order to achieve shorter evaluation times it is advantageous if a configuration is provided which breaks down the digital number sequences into a time sequence of segments. In order to be able to compare the individual characterized parameters associated with the segments with each other, it is advantageous, if a configuration is provided, which separates the numerical sequences into a time sequence of segments with an equal number of measured values in each instance. In order to obtain an indication of reliability of the series connected measured value processor, it is advantageous if a configuration is provided, which for each segment carries out standardization to diminishing arithmetic means. Processing the measured values becomes simpler if a configuration is provided through which scaling can be carried out proportional to the measured values of the current and the voltage. If in a configuration the cross correlation function of the measured voltage and the current is formed, a measure for the similarity of the signals of the current and the voltage follows from this. If a configuration is provided, which utilizes the maximum for the cross correlation function as well as its position in time for the classification of the state of the installation, the time positions indicate quantifiable parameters for the state of the installation, while the cross correlation function represents a general measure of it. A simple method for converting signals into the frequency range results if a configuration is provided, which forms the Fourier transforms of the measured voltage and current. The conjugate-complex product of the Fourier transforms of the voltage and the current is a measure of the complex power converted in the installation. The determination of the amount and phase of individual frequency ranges of the product can be utilized for classifying the state of the installation. The amount and phase form a quantifiable value for the power converted in the installation with respect to the value and phase position of individual lines. For classifying the state of the installation, it is moreover of advantage if a configuration is provided in which the complex quotient of the Fourier transforms of voltage and current for the associated as well as the amount and the phase of individual frequency ranges of the quotient are formed. In order to avoid erroneous switching off through extraneous interferences it is of advantage if a configuration is provided, which depending on the grid, permits the preset parameters and limit values to automatically track the superposed high-frequency interference voltage and currents of the installation component. A simple adaptation to varying states of the grid, for example through switching-on of additional users, can take place, if a configuration is provided, which as a function of the variations of the grid state automatically tracks the pre-set parameters and limit values. In order to keep the evaluation time as short as possible, it is of advantage if several digital function modules are provided for parallel investigation of the measured currents and voltages. Further shortening of the evaluation time is accomplished, if the individual segments overlap in time and are simultaneously investigated parallel. An early simple short-circuit recognition can be achieved, if a configuration is provided which evaluates the time sequence of the parameters characterizing the individual segments. Here, for example, extrapolation is considered based on varying differences.

BRIEF DESCRIPTION OF THE DRAWINGS

An embodiment according to the invention is described with reference to the drawings, in which.

DETAILED DESCRIPTION

Figure 1:
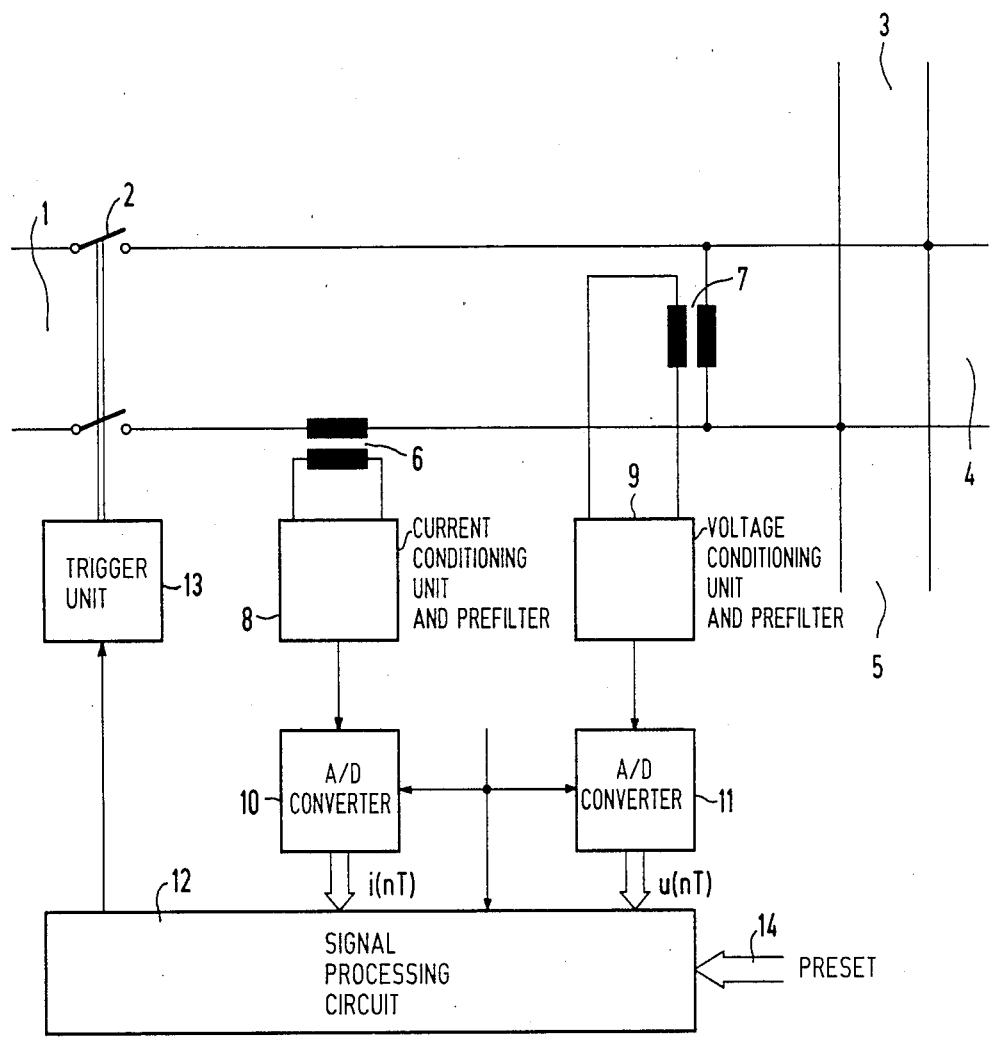
FIG. 1 represents schematically an installation part protected by a circuit-breaker with n outputs.

The low-voltage distribution system represented in FIG. 1 is connected to the grid 1 via the circuit-breaker 2. In the embodiment, users 3, 4, and 5 are indicated. The current i after the circuit breaker 2 is detected via a current transformer 6 and the voltage u of the installation part via a voltage transformer 7. The configurations 8 and 9 connected on the secondary sides of the respective current and voltage transformers 6 and 7 regulate the adaptation of the levels to the range of modification of the subsequent analog-digital converters 10, 11. In the configurations 8, 9, furthermore, preliminary filters are provided, which are intended to avoid passage of grid frequency components in the transmitted voltages and currents. The analog-digital converter 10, 11 are connected to a signal processing circuit 12 which in turn influences a trigger unit 13, which is connected to the circuit breaker 2. The circuit breaker 2 can also be an electronic switch, for example, a thyristor. The appropriate pre-setting for the signal processing circuit 12 is indicated by an arrow 14. In the signal processing circuit 12 one or several memory elements or ROM structural components carry out processes of identification and classification of the states of the installation downstream from the transformers 6, 7 on the basis of suitably selected parameters with a comparison being carried out with the preset or also adaptively tracking parameters, evaluation is made regarding the presence of short-circuits and a command for triggering the circuit breakers is generated.

Figure 2:
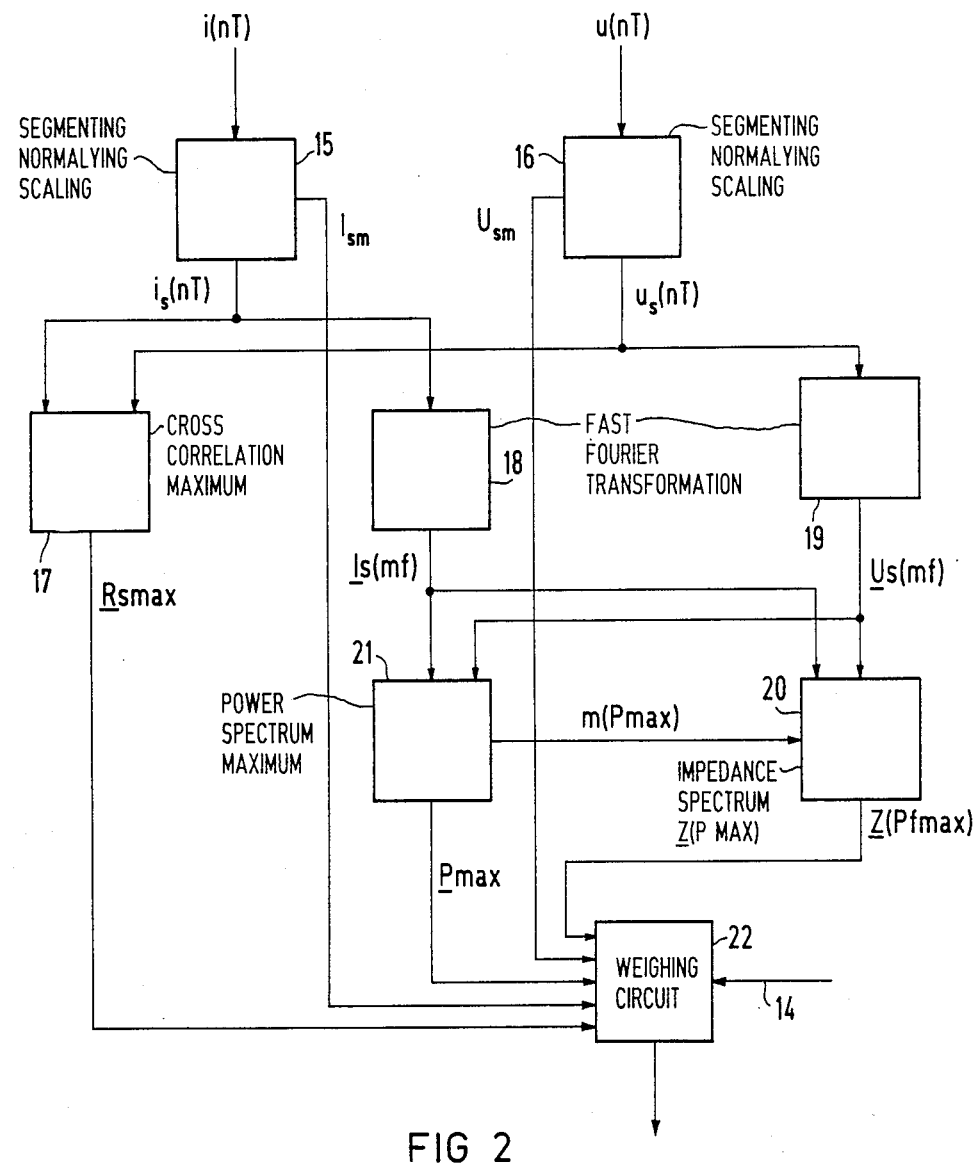
FIG. 2 shows a signal processing scheme in accordance with the invention.

A possible mechanism of operation of the signal processing circuit 12 is represented in FIG. 2, which presupposes only minimal 'a priori' knowledge of the installation. In the first step the digitized current and voltage values $i(nT)$, $u(nT)$ are broken down into time segments of length Tseg (approximately 30 us to 100 us), with the number of values contained in one segment being an integer multiple of two. Of the value sequence within the individual segments the respective arithmetic means $I_{sm}$ and $U_{sm}$ are formed, the value sequence standardized through formation of, respectively, $(i(nT)-I_{sm})$ and $(u(nT)-U_{sm})$ and scaled to the transmission factor obtained from the signal processing chain passed up to this point. Dividing into segments, standardizing and scaling for current and voltage are indicated in box 15 and 16. Further details about segmentaion, standardization and scaling can be found in Brigham, Oldenburg (publ.), second edition. p. 247. The segmented, standardized and scaled value sequences, respectively, $i_s(nT)$ $u_s(nT)$, are cross correlated and the maximum and its position determined. If the obtained value for the magnitude of Rsmax is smaller than a given threshold, then an event influencing both voltage and current simultaneously downstream from the transformers can be largely excluded, especially, if the position of the maximum has a large time distance from the zero point of the cross correlation function. The cross correlation is indicated in FIG. 2 by box 17 and described in greater detail in Brigham, Oldenburg, second edition, p. 84.

In a further step the value sequences $i_s(nT)$ and $u_s(nT)$ are subjected to a fast Fourier transformation (FFT) so that for the individual time segments the complex amplitude spectra Is(mf) and Us(mf) are available. Further details regarding the FFTs can be found in Brigham, Oldenburg, second edition, p. 181. The conjugate-complex product of the two value sequences yields the complex power spectrum P(mf), which is an illustration of the power conversion of the installation downstream from the transformers. After determining the most efficient line or also the highest-power frequency band Pmax for the individual time segments, through comparison with values which are specific for the installation with respect to deviation of magnitude and phase from the standard state can be inferred. The Fast Fourier transformation stages for current and voltage are labeled 18, 19.

A measure of the impedance Z of the part of the installation downstream from the transformers during the successive time segments is obtained by forming the quotient of Us(mf) and Is(mf), see reference number 20, and it is advisable to select the range in which Pmax has been found. Determination of the impedance spectrum can be found in the publication Unbehauen, published by Springer, second edition, p. 239. By comparing the values calculated from the current and voltage variations with respect to magnitude and phase with the specified impedance of the installation part downstream from the transformers, differentiation of inductive and capacitive users, their switching on and switching off and short-circuit determination are possible. Since high frequency voltages and currents are superposed as interferences on the grid voltage at each point in time, transient current and voltage variations due to short-circuit is not absolutely essential for the determination of the impedance. 21 denotes the stage representing the power spectrum maximum. Determination methods for the power spectrum can be found in the publication, Stearns "Digital Signal Analysis". Publisher Oldenburg, first edition, p. 316.

The calculated values for Ism, Usm, Rsmax, Pmax. Z(Pmax) are combined in an identification vector and classified. Evaluation through comparison with installation specific values from the presettings leads to the trigger command for the circuit breaker or to the blocking command for the thyristor. Further improvements of the mechanism of operation of the configuration can be obtained through continuous adjustment of the preset comparison values to normal variations of the installation state and through weighing of the time sequence of the vectors characterizing the individual segments with nominal (typicalized) shape. 22 denotes the actual weighing circuit.

Rapid execution of the above mentioned algorithms of the signal processing and weighing can be achieved through concurrent processing of the individual function blocks with the aid of multiple arrangements of processors compared to serial processing with only one processor. Further increase in the speed of processing is possible through overlapping segmentation if increased expenses are accepted in the bargain; thus, fourfold overlapping, for example, reduces the numerical processing time to one fourth.

In the foregoing specification, the invention has been described with reference to a specific exemplary embodiment thereof. It will, however, be evidence that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. Apparatus for rapid detection of short-circuits in an electrical installation comprising means generating an electrical trigger command operating a circuit breaker of the electrical installation in the event of a short circuit comprising an electronic measuring and processing arrangement receiving instantaneous current and voltage values from the electrical installation, said measuring and processing arrangement comprising a digital comparison circuit comparing the current values to pre-settable limit values and transmitting the trigger command in the event the instantaneous current values exceed at least one of the limit values, the measuring and processing arrangement further comprising means for determining from measured variations of the current and the voltage of a power source of the electrical installation the complex impedances and power, said means for determining from the measured variations being coupled to said digital comparison circuit, whereby the detected complex impedances and power and compared to preset limit values of complex power and impedance and said trigger command is generated when at least one of said preset limit values is exceeded.

2. The apparatus recited in claim 1, further comprising means for converting current and voltage as a function of time into an associated frequency range.

3. The apparatus recited in claim 1 further comprising means for executing identification calculations and classifications of electrical parameters of the installation.

4. The apparaus recited in claim 3, further comprising means for tracking, as a function of the power source, superposed high-frequency interference voltages and interference currents of the electrical installation operationally with the electrical parameters and limit values automatically.

5. The apparatus recited in claim 3, further comprising means for tracking, as a function of the variations of the state of the power source, the electrical parameters and limit values.

6. The apparatus recited in claim 1, further comprising means for filtering the current and voltage values prior to further signal processing.

7. The apparatus recited in claim 6, further comprising means for converting the current and voltage values after filtering into digital number sequences and for executing further signal processing with digital electrical function modules.

8. The apparatus recited in claim 7, further comprising means for dividing the digital number sequences into a time sequence of segments.

9. The apparatus recited in claim 8, wherein the means for dividing comprises means for dividing the digital number sequences into a time sequence of segments having in each instance an equal number of measured values.

10. The apparatus recited in claim 8, wherein the means for dividing further comprises means for normalizing each particular segment to a diminishing arithmetic mean.

11. The apparatus recited in claim 8, wherein the means for dividing further comprises means for scaling proportional to the current and voltage values.

12. The apparatus recited in claim 8, further comprising means for examining the individual segments in overlapping time and in parallel.

13. The apparatus recited in claim 8, further comprising means for evaluating parameters characterizing the time sequence of the individual segments.

14. The apparatus recited in claim 1, further comprising means for performing a cross correlation of the voltage and current values.

15. The apparatus recited in claim 14, further comprising means for utilizing the maximum of the cross correlation and its position as a function of time for classifying the state of the installation.

16. The apparatus recited in claim 1, further comprising means for forming Fourier transforms of the voltage and current values.

17. The apparatus recited in claim 16, further comprising means for forming the conjugate-complex product of the Fourier transforms of the voltage and current values for frequency ranges associated with each other.

18. The apparatus recited in claim 17, further comprising means for utilizing the magnitude and the phase of individual frequency ranges of the conjugate-complex products for the classification of the state of the installation.

19. The apparatus recited in claim 12, further comprising means for forming the complex quotient of the Fourier transforms of the voltage and current values for the frequency ranges associated with each other as well as the magnitude and the phase of individual frequency ranges of the quotients.

20. The apparatus recited in claim 1, further comprising a plurality of digital function modules for parallel investigations of the current and voltages.

* * * * *